US009061319B2

(12) United States Patent
Ko

(10) Patent No.: US 9,061,319 B2
(45) Date of Patent: Jun. 23, 2015

(54) ULTRASOUND PROBE

(75) Inventor: Hyun Phill Ko, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 625 days.

(21) Appl. No.: 13/363,449

(22) Filed: Feb. 1, 2012

(65) Prior Publication Data

US 2012/0206021 A1 Aug. 16, 2012

(30) Foreign Application Priority Data

Feb. 11, 2011 (KR) ........................ 10-2011-0012498

(51) Int. Cl.
*H01L 41/09* (2006.01)
*B06B 1/06* (2006.01)

(52) U.S. Cl.
CPC .................................... *B06B 1/0611* (2013.01)

(58) Field of Classification Search
USPC ......................................... 310/328, 366, 334
See application file for complete search history.

(56) References Cited

U.S. PATENT DOCUMENTS

| | | | | |
|---|---|---|---|---|
| 2,385,896 A * | 10/1945 | Von Beckerath | ............. | 310/365 |
| 6,121,718 A | 9/2000 | Mohr, III | | |
| 6,573,638 B1 * | 6/2003 | Yamamoto | .................... | 310/359 |
| 7,795,786 B2 * | 9/2010 | Nakayama et al. | ........... | 310/334 |
| 2003/0222240 A1 * | 12/2003 | Sasaki et al. | .................... | 252/62 |
| 2004/0095042 A1 * | 5/2004 | Sube et al. | .................... | 310/328 |
| 2005/0206274 A1 * | 9/2005 | Kobane et al. | ................ | 310/328 |
| 2005/0248235 A1 * | 11/2005 | Namerikawa et al. | ........ | 310/328 |
| 2007/0236106 A1 * | 10/2007 | Koc et al. | ...................... | 310/366 |
| 2013/0107422 A1 * | 5/2013 | Lee et al. | .................. | 361/321.2 |

FOREIGN PATENT DOCUMENTS

JP 2007-273584 A 10/2007

* cited by examiner

*Primary Examiner* — Thomas Dougherty
(74) *Attorney, Agent, or Firm* — Cha & Reiter, LLC.

(57) ABSTRACT

Disclosed herein is an ultrasound probe including a plurality of piezoelectric elements forming a laminate, a plurality of internal electrodes formed at the lamination interface, an external electrode formed on the front or the rear surface of the laminate. The ultrasound probe includes a plurality of piezoelectric elements forming a laminate, a plurality of internal electrodes interposed among the piezoelectric elements, and an external electrode formed on the front or rear surface of the laminate, wherein the external electrode includes a first external electrode and a second external electrode disposed to have a space therebetween.

16 Claims, 9 Drawing Sheets

ULTRASOUND PROBE

CLAIM OF PRIORITY

This application claims priority from Korean Patent Application No. 2011-0012498, filed on Feb. 11, 2011 in the Korean Intellectual Property Office, the disclosure of which is incorporated herein by reference.

BACKGROUND

1. Field

Apparatuses consistent with exemplary embodiments relate to an ultrasound probe having a plurality of piezoelectric elements which form a laminate.

2. Description of the Related Art

Ultrasound probes produce internal views of a subject by transmitting ultrasonic waves into the subject and receiving ultrasonic echoes which are reflected from the subject. The ultrasound probe may contain a piezoelectric material in a single-layer or a multi-layer laminate configuration to transmit ultrasonic waves into and receive ultrasonic echoes from the subject.

In general, an ultrasound probe forming a laminate makes it easier to control impedance and voltage. As a result, the ultrasound probe may obtain good sensitivity, good energy conversion efficiency, and a smooth spectrum.

The laminated ultrasound probe requires electrodes, including a ground electrode and a signal electrode, connected respectively to piezoelectric elements, so that the electrodes apply an electrical signal to the piezoelectric elements. Therefore, an increase in the number of laminated layers means an increase in the number of electrodes which apply an electrical signal to the piezoelectric elements. In this regard, the connections between the electrodes and piezoelectric elements may become complex. As a result, ultrasound probe design may also be complex.

SUMMARY

Exemplary embodiments provide an ultrasound probe including a plurality of piezoelectric elements forming a laminate, a plurality of internal electrodes interposed among the piezoelectric elements, and an external electrode formed on a front or rear surface of the laminate.

In accordance with an aspect of an exemplary embodiment there is provided an ultrasound probe including, a plurality of piezoelectric elements forming a laminate, a plurality of internal electrodes interposed among the piezoelectric elements, and an external electrode formed on a front or rear surface of the laminate, wherein the external electrode includes a first external electrode and a second external electrode disposed to have a space therebetween.

The first external electrode may be a ground electrode and the second external electrode may be a signal electrode.

The internal electrodes may include a plurality of first internal electrodes connected with the first external electrode and a plurality of second internal electrodes connected with the second external electrode.

The first internal electrodes and the second internal electrodes may be alternately interposed among the plurality of piezoelectric elements.

The first internal electrode may have one end exposed to one side surface of the laminate, and the second internal electrode may have one end exposed to the opposite side surface of the laminate.

The ultrasound probe may further include a first connecting electrode connected with the first external electrode and a second connecting electrode connected with the second external electrode.

The first connecting electrode may be formed on one side surface of the laminate, while connected with the first external electrode, and the second connecting electrode may be formed on the opposite side surface of the laminate, while connected with the second external electrode.

The ultrasound probe may further include a signal supply which is installed on any one of a front or rear surface of the laminate to supply a signal to the external electrode.

The signal supply may be any one of a flexible printed circuit board (FPCB), a printed circuit board (PCB), or a wire.

The ultrasound probe may further include a dummy layer interposed between the external electrode and the piezoelectric element to which the external electrode is laminated.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION OF EXEMPLARY EMBODIMENTS

Figure 1:
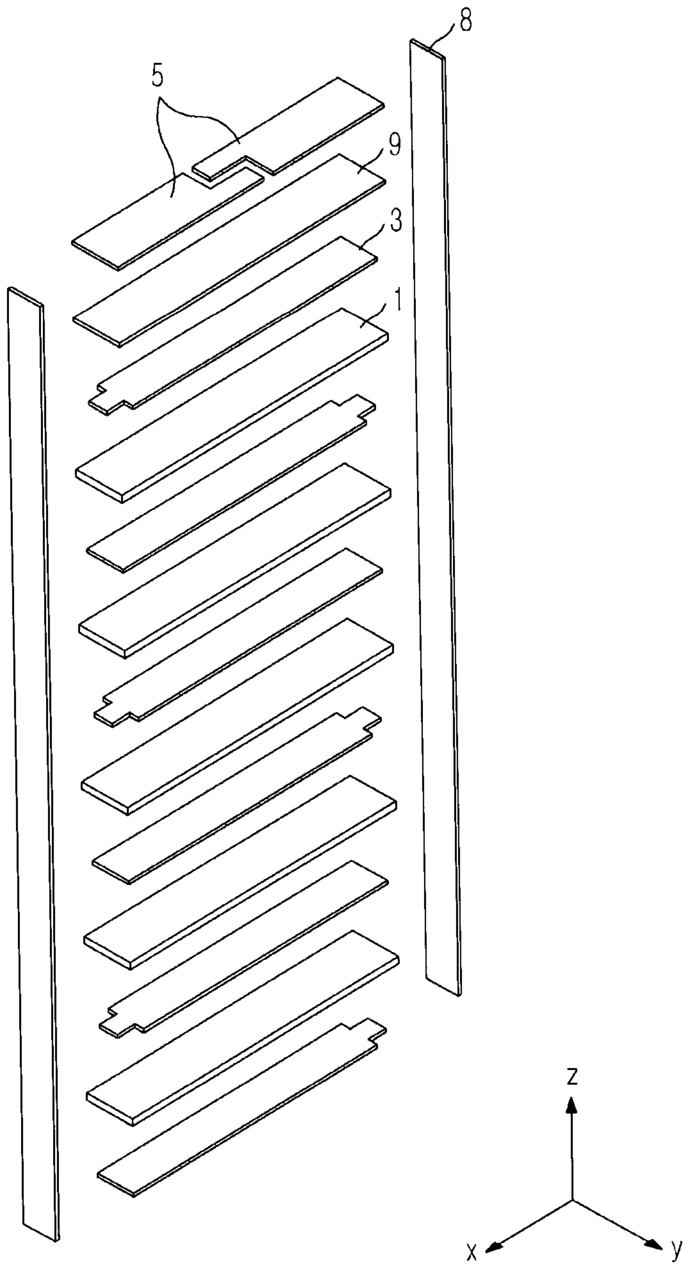
FIG. 1 is an exploded perspective view showing an ultrasound probe forming a laminate according to an exemplary embodiment.

Reference will now be made in detail to the exemplary embodiments of the present invention, examples of which are illustrated in the accompanying drawings, wherein like reference numerals refer to like elements throughout.

FIG. 1 is an exploded perspective view showing an ultrasound probe forming a laminate according to an exemplary embodiment.

The ultrasound probe includes, a plurality of piezoelectric elements 1, a plurality of internal electrodes 3 interposed among the piezoelectric elements, an external electrode 5 arranged on a front surface of the piezoelectric elements, and connecting electrodes 8 which connect the external electrode 5 and the internal electrodes 3.

The piezoelectric elements 1 and the internal electrodes 3 are alternately stacked to form a laminate.

The piezoelectric elements 1 are made of a piezoelectric material exhibiting a piezoelectric effect, namely, generation of a voltage in response to a mechanical pressure applied thereto and mechanical deformation in response to a voltage applied thereto. That is, the piezoelectric element 1 converts electrical energy into mechanical vibration energy and mechanical vibration energy into electrical energy.

The piezoelectric element 1 may be formed of a lead zirconate titanate (PZT) ceramic, a single crystal made of a solid solution of lead magnesium niobate and lead titanate (PZMT), or a single crystal made of a solid solution of lead zinc niobate and lead titanate (PZNT). However, exemplary embodiments are not limited thereto.

The internal electrodes 3 are interposed among the piezoelectric elements 1 to apply an electrical signal to the piezoelectric elements 1.

Figure 2A:
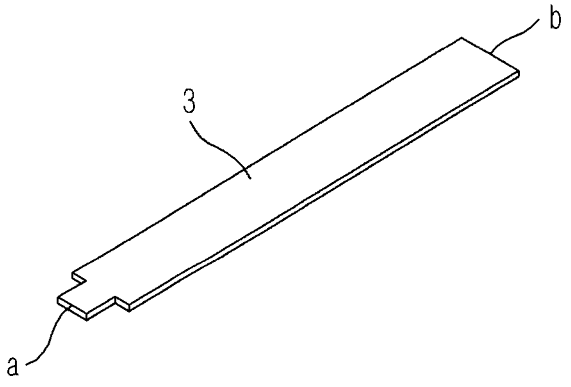
FIGS. 2A and 2B are views each showing an internal electrode according to an aspect of an exemplary embodiment.
Figure 2B:
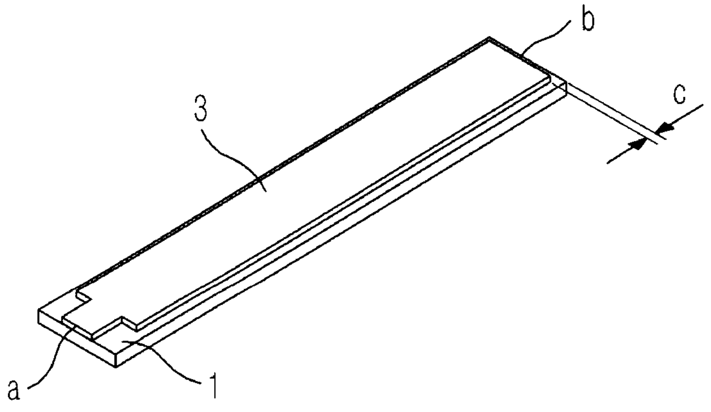
Figure 3A:
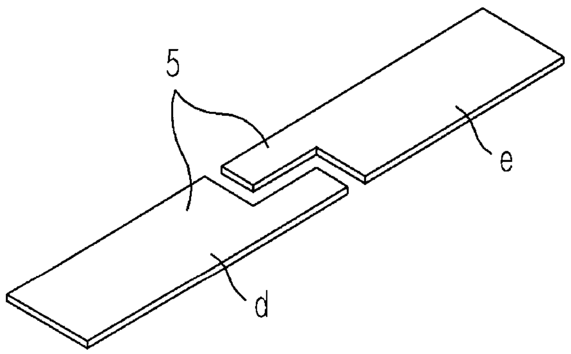
FIGS. 3A and 3B are views each showing an external electrode according to an aspect of an exemplary embodiment.
Figure 3B:
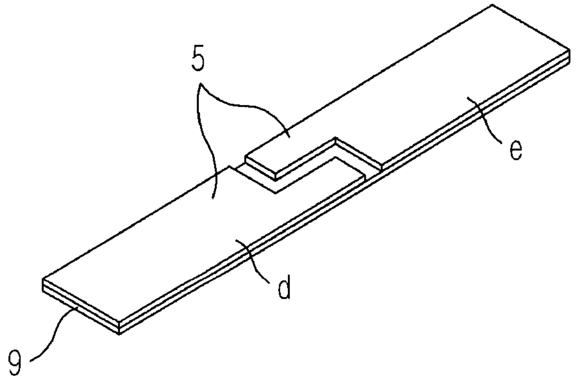

Each internal electrode 3 may be formed such that one end (hereinafter referred to as an exposed end A) thereof is exposed at one side surface of the laminate (parallel to the y-axis) and the other end (hereinafter referred to as an unexposed end B) thereof is hidden at the opposite side surface of the laminate (see FIGS. 2A and 2B).

For example, the internal electrode 3 is formed to have a shorter length than the piezoelectric element 1 (the length in the x-axis direction). Thus, when the exposed end A is disposed to be exposed at one side surface of the laminate, the unexposed end B is naturally spaced apart from the opposite side surface of the laminate by a predetermined spacing C, so that the unexposed end B is hidden at the opposite side surface of the laminate.

The internal electrodes 3 having the above-described configuration may be formed among the piezoelectric elements 1 such that the exposed ends A of the internal electrodes 3 are alternately exposed at the opposite side surfaces of the laminate.

For example, for a laminate of five piezoelectric elements 1, a total of six internal electrodes 3 including two electrodes respectively arranged on a front surface of the frontmost (in the +z-axis direction) piezoelectric element 1 and a rear surface of the rearmost (in the −z-axis direction) piezoelectric element 1, and four electrodes interposed among the five piezoelectric elements 1, may be provided. If the exposed end A of the internal electrode 3 arranged at the frontmost surface is disposed at the left side surface (in the +x-axis direction) of the laminate, the exposed ends A of the following internal electrodes 3 may be disposed in the order of right (in the −x-axis direction), left, right, left, and finally right side surface of the laminate.

The external electrode 5 may be formed on the front surface or the rear surface of the laminate.

Figure 4:
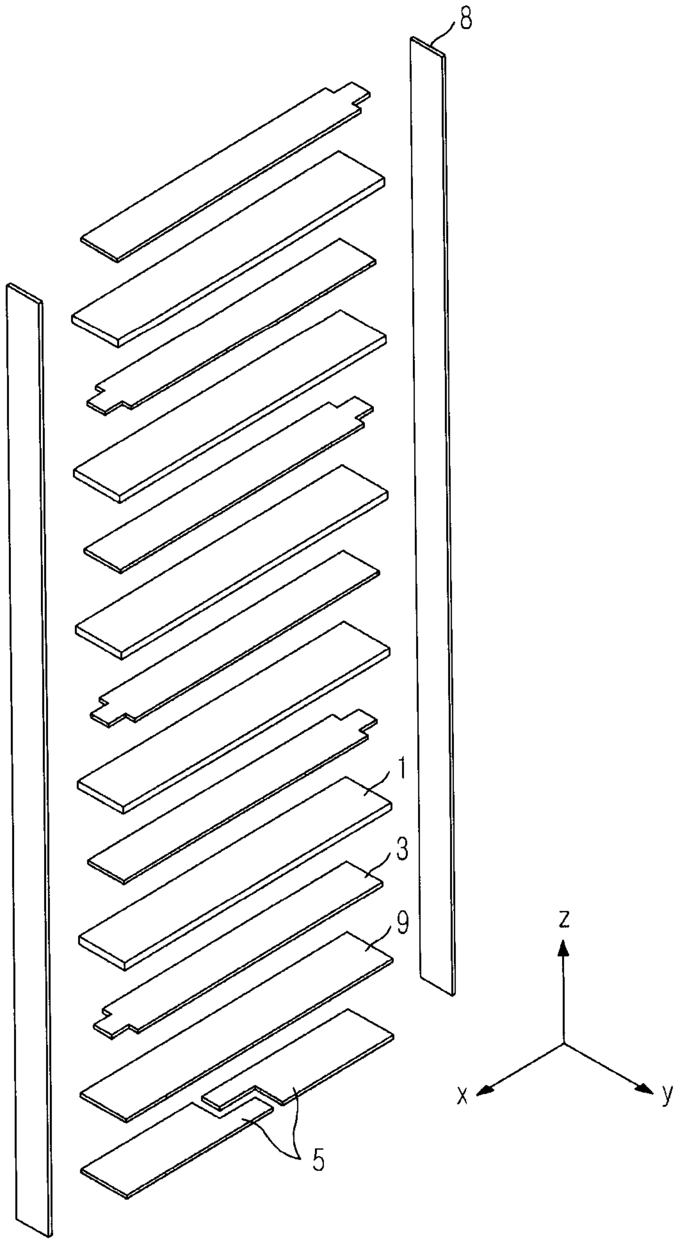
FIG. 4 is an exploded perspective view showing an ultrasound probe forming a laminate according to an exemplary embodiment.

FIG. 1 illustrates the external electrode 5 formed on the front surface of the laminate and FIG. 4 illustrates the external electrode 5 formed on the rear surface of the laminate.

The external electrode 5 receives an electrical signal and then applies the signal to the piezoelectric elements 1 of the laminate. The external electrode 5 includes a first external electrode D which serves as a ground electrode and a second external electrode E which serves as a signal electrode. For convenience of description, the first and second external electrodes D and E will also be designated by reference numeral "5".

The first and second external electrodes 5 may be formed on the front or the rear surface of the laminate, to be flush with each other.

The facing ends of the first and second external electrodes 5 are spaced apart from each other so that there is no contact between the first and second electrodes 5. Further, the opposite ends of the first and second electrodes 5 are exposed at both sides of the laminate, respectively.

When the external electrode 5 is formed on the front surface of the laminate, a dummy layer 9 is formed on the rear surface of the external electrode 5 to prevent the external electrode 5 from contacting the internal electrode 3. When the external electrode 5 is formed on the rear surface of the laminate, a dummy layer 9 is formed the front surface of the external electrode 5 to prevent the external electrode 5 from contacting the internal electrode 3.

The external electrode 5 receives an electrical signal from a signal supply (not shown). The signal supply may be a flexible printed circuit board (FPCB), a printed circuit board (PCB), or a wire. However, exemplary embodiments of are not limited thereto.

The connecting electrodes 8 are formed on both side surfaces of the laminate, respectively.

When an electrical signal is applied to the external electrode 5 from the signal supply, the connecting electrodes 8 transfer the electrical signal to the internal electrodes 3 interposed among the piezoelectric elements 1.

For example, the first external electrode D, which serves as a ground electrode, includes a connecting electrode 8 contacting the exposed ends A of the three internal electrodes 3 (hereinafter referred to as first internal electrodes) disposed at the left side surface (in the +x-axis direction) of the laminate. Also, the second external electrode E, which serves as a signal electrode, includes a connecting electrode 8 contacting the exposed ends A of the three internal electrodes 3 (hereinafter referred to as second internal electrodes) disposed at the right side surface (in the −x-axis direction) of the laminate. The example of FIG. 1 shows that each piezoelectric element 1 and internal electrode 3 has a generally rectangular profile (oblong profile).

Power supplied to the external electrode 5 is transferred as an electrical signal to the six internal electrodes 3 via the connecting electrodes 8. In response to the electrical signal, a voltage is generated between the internal electrodes 3 interposed among the piezoelectric elements 1. As a result, the voltage is applied to the five piezoelectric elements 1 forming the laminate.

As is apparent from the above description, the ultrasound probe according to an exemplary embodiment includes the piezoelectric elements 1, which forms a laminate, and an electrode arrangement including the external electrodes 5, connecting electrodes 8, and internal electrodes 3, and the exposed ends A of the internal electrodes 3 interposed among the laminated piezoelectric elements 1 are alternately disposed at the opposite side surfaces of the laminate. In this case, voltage applied to the piezoelectric elements 1 generates polarization of the piezoelectric elements 1 in the lamination direction, thereby resulting in displacement of the piezoelectric elements 1 in the lamination direction. The displacement of the respective piezoelectric elements 1 is accumulated to obtain a larger displacement overall. Therefore, the ultrasound probe may produce a greater ultrasound output.

FIG. 4 is an exploded perspective view showing an ultrasound probe forming a laminate according to an exemplary embodiment. The ultrasound probe forming a laminate shown in FIG. 4 is the same as the ultrasound probe forming a laminate shown in FIG. 1; except that, an external electrode 5 is formed on the rear surface of the laminate, thus additional descriptions thereof will be omitted.

Figure 5A:
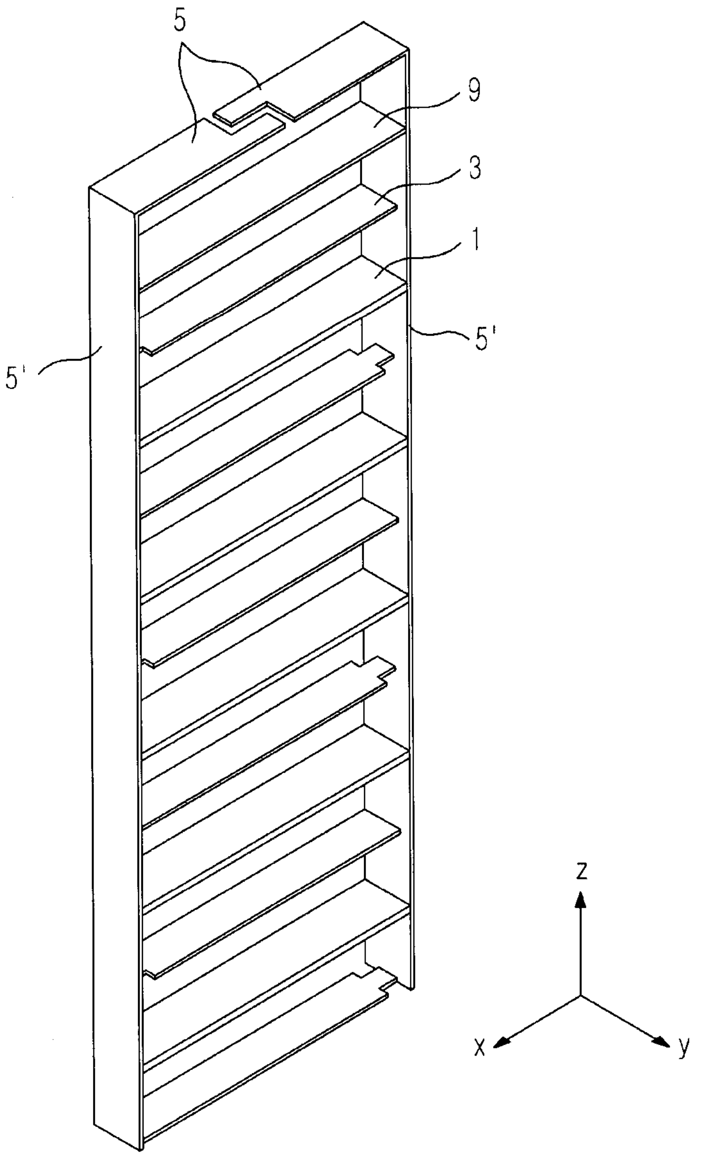
FIGS. 5A and 5B are exploded perspective views each showing an ultrasound probe forming a laminate according to another exemplary embodiment.
Figure 5B:
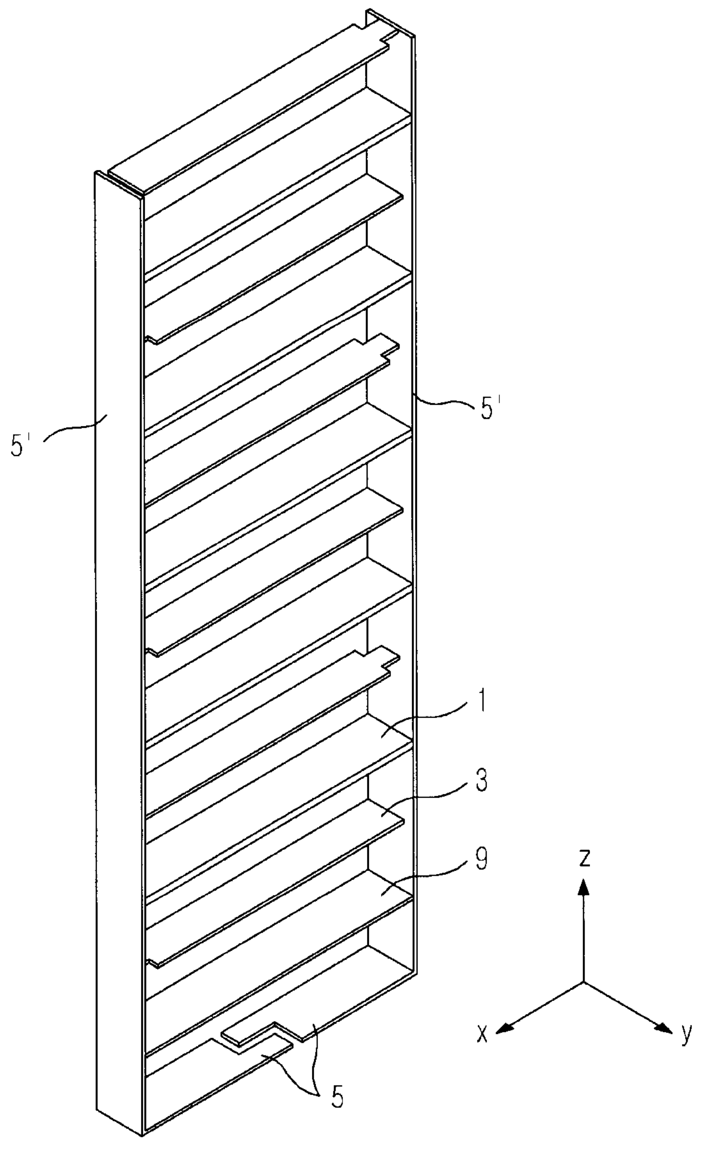
Figure 6:
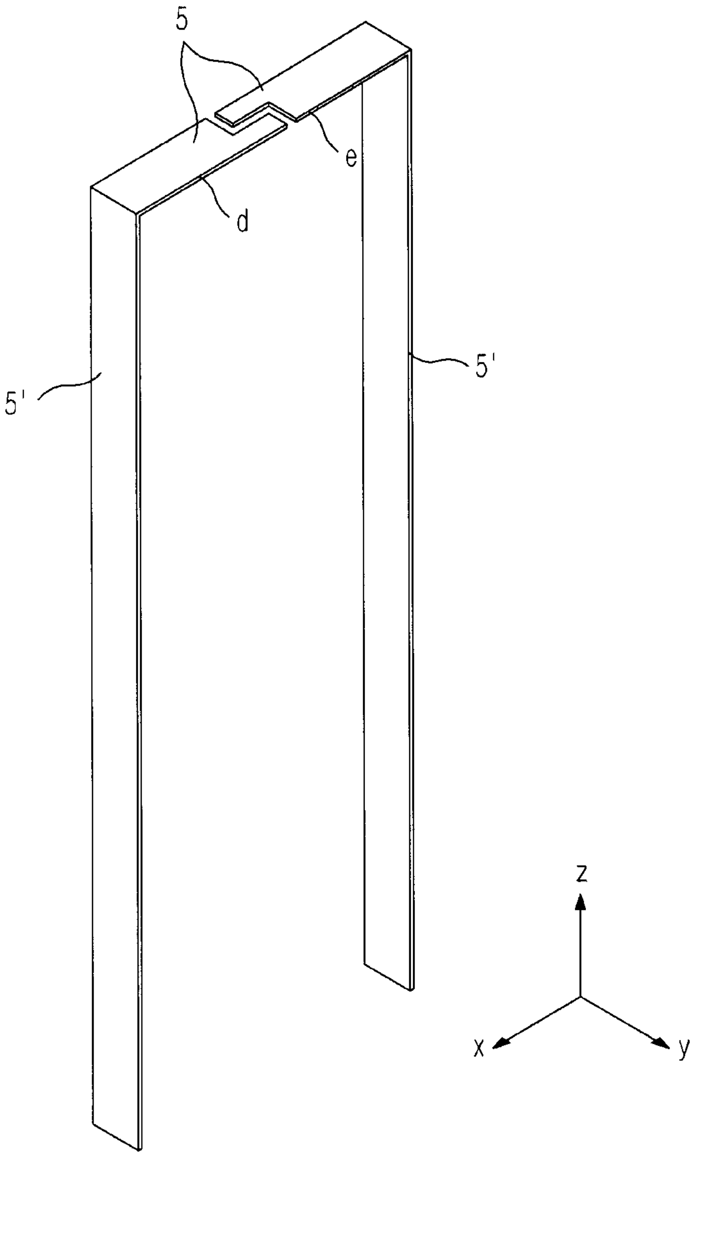
FIG. 6 is a view showing an external electrode according to an aspect of another exemplary embodiment.

FIGS. 5A and 5B are exploded perspective views each showing an ultrasound probe forming a laminate according to another exemplary embodiment.

The ultrasound probe according to another exemplary embodiment includes a plurality of piezoelectric elements 1 forming a laminate, a plurality of internal electrodes 3 interposed among the piezoelectric elements 1, an external electrode 5 arranged on the front or the rear surface of the laminate.

Descriptions on the piezoelectric element 1 and the internal electrode 3 are the same as the respective components in FIG. 1, thus additional descriptions thereof will be omitted.

FIG. 5A illustrates an external electrode 5 formed on the front surface of the laminate and FIG. 5B illustrates an external electrode 5 formed on the rear surface of the laminate.

The external electrode 5 receives an electrical signal and then applies the signal to the piezoelectric elements 1 of the laminate. The external electrode 5 includes a first external electrode D which serves as a ground electrode and a second external electrode E which serves as a signal electrode. For convenience of description, the first and second external electrodes D and E will also be designated by reference numeral "5".

The first and second external electrodes 5 may be formed on the front or the rear surface of the laminate, to be flush with each other.

When the first and second external electrodes 5 are formed on the front surface of the laminate, the facing ends of the respective external electrodes 5 are spaced apart from each other so that there is no contact between the first and second external electrodes 5. Further, unlike the first and second external electrodes 5 in FIG. 1, the opposite ends of the respective first and second external electrodes 5 are extended in the rearward direction (in the −z-axis direction) to contact both side surfaces of the laminate.

When the first and second external electrodes 5 are formed on the rear surface of the laminate, the facing ends of the respective first and second external electrode 5 are spaced apart from each other so that there is no contact between the first and second external electrodes 5. Further, unlike the first and second external electrodes 5 in FIG. 4, the opposite ends of the respective first and second external electrodes 5 are extended in the forward direction (in the +z-axis direction) to contact both side surfaces of the laminate. That is, each external electrode 5 has a form in which one connecting electrodes 8 and one external electrode 5 in FIG. 1 or FIG. 4 are united into one electrode.

For example, the first external electrode D, which serves as a ground electrode, includes an extension part 5' contacting the exposed ends A of the three first internal electrodes 3 disposed at the left side surface (in the +x-axis direction) of the laminate. Also, the second external electrode E, which serves as a signal electrode, includes an extension part 5' contacting the exposed ends A of the three second internal electrodes 3 disposed at the right side surface (in the −x-axis direction) of the laminate.

As described in conjunction with FIG. 1, when the external electrode 5 is formed on the front surface of the laminate, a dummy layer 9 is formed at the rear surface of the external electrode 5 to prevent the external electrode 5 from contacting the internal electrode 3. Meanwhile, when the external electrode 5 is formed on the rear surface of the laminate, a dummy layer 9 is formed at the front surface the external electrode 5 to prevent the external electrode 5 from contacting the internal electrode 3.

Power supplied to the external electrode 5 having the extension part 5' is transferred as an electrical signal to the six internal electrodes 3. In response to the transferred the electrical signal, a voltage is generated between the internal electrodes 3 formed on the front and rear surfaces of each piezoelectric element 1. As a result, the voltage is applied to the respective piezoelectric elements 1 forming the laminate.

The voltage applied to the piezoelectric elements 1 generates polarization of the piezoelectric elements 1 in the lamination direction, thereby resulting in displacement of the piezoelectric elements 1 in the lamination direction. The displacement of the respective piezoelectric elements 1 is accumulated to obtain a larger displacement overall. Therefore, the ultrasound probe may produce a greater ultrasound output.

When the ultrasound probe is designed such that the external electrode 5 has extension parts 5', it may be possible to install the signal supply on the front or the side surface of the laminate. Therefore, the degree of freedom in design of the ultrasound probe may be improved.

The ultrasound probe according to one aspect of the exemplary embodiments may improve the degree of freedom in design thereof.

Further, the ultrasound probe according to one aspect of the exemplary embodiments may increase sensitivity by reducing the electrical impedance and improving the vibration performance.

Furthermore, the ultrasound probe according to one aspect of the exemplary embodiments may be applied to the production of a 2-dimensional array.

Although a few exemplary embodiments have been shown and described, it would be appreciated by those skilled in the art that changes may be made in these exemplary embodiments without departing from the principles and spirit of the inventive concept, the scope of which is defined in the claims and their equivalents.

What is claimed is:

1. An ultrasound probe comprising:

a plurality of piezoelectric elements;

a plurality of internal electrodes interposed among the piezoelectric elements to form a laminate;

an ultrasound probe signal supply;

external electrodes formed on a front or rear surface of the laminate; and a dummy layer formed on the external electrodes and interposed between the external electrodes and the laminate, wherein the external electrodes comprise a first external electrode spaced apart from a second external electrode, and the first and second external electrodes receive an electrical signal from the ultrasound probe signal supply, causing displacement of the piezoelectric elements and generation of an ultrasound output of the ultrasound probe.

2. The ultrasound probe according to claim 1, wherein the first external electrode comprises a ground electrode and the second external electrode comprises a signal electrode.

3. The ultrasound probe according to claim 1, wherein the internal electrodes comprise a plurality of first internal electrodes connected with the first external electrode and a plurality of second internal electrodes connected with the second external electrode.

4. The ultrasound probe according to claim 3, wherein the first internal electrodes and the second internal electrodes are alternately interposed among the plurality of piezoelectric elements.

5. The ultrasound probe according to claim 3, wherein the first internal electrode comprises one end exposed to one side surface of the laminate, and the second internal electrode comprises one end exposed to the opposite side surface of the laminate.

6. The ultrasound probe according to claim 1, further comprising a first connecting electrode connected with the first external electrode and a second connecting electrode connected with the second external electrode.

7. The ultrasound probe according to claim 6, wherein the first connecting electrode is formed on one side surface of the laminate, while connected with the first external electrode, and the second connecting electrode is formed on an opposite side surface of the laminate, while connected with the second external electrode.

8. The ultrasound probe according to claim 1, wherein the signal supply is installed on any one of the front or the rear surface of the laminate.

9. The ultrasound probe according to claim 8, wherein the signal supply comprises a flexible printed circuit board, a printed circuit board, or a wire.

10. The ultrasound probe according to claim 1, wherein the plurality of piezoelectric elements comprise a lead zirconate titanate ceramic, a single crystal made of a solid solution of lead magnesium niobate and lead titanate, or a single crystal made of a solid solution of lead zinc niobate and lead titanate.

11. The ultrasound probe according to claim 1, wherein the first external electrode comprises an extension part contacting exposed ends of the internal electrodes disposed at one side surface of the laminate.

12. The ultrasound probe according to claim 11, wherein the second external electrode comprises an extension part contacting exposed ends of the internal electrodes disposed at opposite side surface of the laminate.

13. An ultrasound probe comprising:

an ultrasound probe signal supply; and a stacked structure comprising:

a plurality of piezoelectric elements;

a plurality of internal electrodes interposed between the piezoelectric elements;

external electrodes disposed on the stacked structure; and a dummy layer formed on the external electrodes and interposed between the external electrodes and the stacked structure, wherein the external electrodes comprise a first external electrode and a second external electrode spaced apart from the first external electrode, the first and second external electrodes receive an electrical signal from the ultrasound probe signal supply, causing displacement of the piezoelectric elements and generation of an ultrasound output of the ultrasound probe.

14. The ultrasound probe according to claim 13, wherein the first external electrode comprises a ground electrode and the second external electrode comprises a signal electrode.

15. The ultrasound probe according to claim 13, wherein the plurality of internal electrodes comprise an exposed end and an unexposed end.

16. The ultrasound probe according to claim 13, wherein a plurality of first internal electrodes are connected with the first external electrode and a plurality of second internal electrodes are connected with the second external electrode.

* * * * *